United States Patent
Demone

(10) Patent No.: US 6,538,465 B1
(45) Date of Patent: Mar. 25, 2003

(54) DIGITALLY CONTROLLED PULSE WIDTH ADJUSTING CIRCUIT

(75) Inventor: Paul Demone, Kanata (CA)

(73) Assignee: Mosaid Technologies Incorporated, Kanata (CA)

(*) Notice: Subject to any disclaimer, the term of this patent is extended or adjusted under 35 U.S.C. 154(b) by 0 days.

(21) Appl. No.: 10/084,620

(22) Filed: Feb. 28, 2002

Related U.S. Application Data

(60) Provisional application No. 60/331,990, filed on Nov. 23, 2001.

(51) Int. Cl.[7] .................... H03K 19/003; H03K 3/017
(52) U.S. Cl. ................... 326/29; 326/93; 327/172
(58) Field of Search ............... 326/29, 93; 327/170, 327/172–174, 176, 263

(56) References Cited

U.S. PATENT DOCUMENTS

| | | | | | |
|---|---|---|---|---|---|
| 5,638,016 A | * | 6/1997 | Eitrheim | ............... | 327/175 |
| 5,764,090 A | * | 6/1998 | Yeh et al. | ............... | 327/174 |
| 5,969,555 A | * | 10/1999 | Suda | ............... | 327/172 |
| 6,366,115 B1 | * | 4/2002 | DiTommaso | ............ | 326/32 |

* cited by examiner

Primary Examiner—Michael Tokar
Assistant Examiner—James A Cho
(74) Attorney, Agent, or Firm—Kevin Pillay; Ogilvy Renault

(57) ABSTRACT

A circuit selectively adjusts the width of an input pulse. The circuit comprises two stages. The first stage delays a leading edge of the input pulse with respect to a trailing edge of the input pulse in accordance with a first control input. The second stage delays the trailing edge of the input pulse with respect to the leading edge of the input pulse in accordance with a second control input. The input pulse width is adjusted in accordance with a difference between the delay of the leading edge and the delay of the trailing edge.

11 Claims, 4 Drawing Sheets

DIGITALLY CONTROLLED PULSE WIDTH ADJUSTING CIRCUIT

This application claims the benefit of provisional application 60/331,990 files Nov. 23, 2001.

The present invention relates to a circuit for dynamically adjusting the width of pulse timing signals.

BACKGROUND OF THE INVENTION

Pin electronics in automated test equipment (ATE) generally requires capability to adjust a relative timing between rising and falling edges of stimulus pulses driven to a device or system being tested. This adjustment capability, or programmability, allows systematic mismatches and skews in signal propagation characteristics of individual test channels to be compensated for during a pre-test calibration procedure. Thus, the programmability is accessible by control logic or software running on a control processor. The test equipment's precision is limited by the performance of the timing adjust circuitry so it is critical that this circuitry operate as precisely and predictably as possible.

Referring to FIG. 1, a pulse width adjusting circuit used in current implementations of ATE pin electronics is illustrated generally by numeral 100. The circuit 100 comprises a pair of digitally controlled delay elements D1 and D2, and AND-gate 102, and OR-gate 104, and a multiplexer 106. An input signal IN is coupled to an input of both delay elements D1 and D2. Output A of delay element D1 is coupled to a first input on both the AND-gate 102 and the OR-gate 104. Output B of delay element D2 is coupled to a second input on both the AND-gate 102 and the OR-gate 104. Outputs A1 and B1 from The AND-gate 102 and OR-gate 104, respectively, are coupled to the input of the multiplexer 106.

The delay element D1 delays the input signal IN by a first delay signal Delay1 and the delay element D2 delays the input signal IN by a second delay signal Delay2. The delay signals Delay1 and Delay2 are adjustable to one of S possible settings by an n-bit control word, where $n \geq \log_2 S$. Referring to FIG. 2, the digital delay elements D1 and D2 characteristics are illustrated. Ideally the delay time Td is linear with propagation delay, ranging from a minimum value $Td_{min}$ for a delay control word input value of 0 to a maximum value $Td_{max}$ for a delay control word input value of S−1. Each delay element offers a resolution of approximately $$\frac{Td_{max} - Td_{min}}{S - 1}$$

and can be realized in a number of ways. For example, the delay element can be realized using a sequence of digital logic gates in which either a switching current, load capacitance, or path length is controlled by the digital control inputs.

Referring to FIGS. 3a and 3b, timing diagrams for the circuit shown in FIG. 1 are illustrated generally by numeral 300 and 350 respectively. FIG. 3a illustrates the timing for an input signal IN, wherein the timing pulse alters the input signal IN from a low value to a high value for a duration of the timing pulse's width W and then returns the input signal IN to a low value. As a result this type of pulse is referred to as a "return to zero" (RTZ) pulse. Conversely, FIG. 3b illustrates the timing for an input signal IN, wherein the timing pulse alters the input signal IN from a high value to a low value for a duration of the timing pulse's width W and then returns the input signal IN to a high value. As a result this type of pulse is often to as a "return to one" (RTO) pulse.

The output A of the delay element D1 is the timing pulse delayed by a first delay $T_{D1}$. The output 13 of the delay element D2 is the tiring pulse delayed by a second delay $T_{D2}$. A delay difference Δt represents the difference between the second delay $T_{D2}$ and first delay $T_{D1}$. In the present example, it is assumed that the difference Δt is positive. The delayed input signal pulses A and B are recombined using the AND-gate 102 and the OR gate 104. For the RTZ pulse, the output A1 of the AND-gate 102 is a pus having a shortened pulse width of W−Δt. The output B1 of the OR-gate 104 is a pulse having a lengthened pulse width of W+Δt. Conversely, for the RTO pulse, the output X of the AND-gate 102 is a pulse having a lengthened pulse width of W+Δt. The output Y of the OR-gate 104 is a pulse having a shortened pulse width of W−Δt. For either pulse, the multiplexer 106 selects either the output A1 of the AND-gate 102 or The output B1 of the OR-gate 104 depending on whether the timing pulse is to be shortened or lengthened.

However, the circuit described above suffers from a number of problems that limit its precision, and thus the precision of ATE systems that incorporate it. One of the most significant problems is a difficulty matching the propagation delay through the AND-gate 102 and the OR gate 104 over the circuit operating range of temperature and power supply voltage, as well as expected manufactng tolerances. The uncertainty in mismatch makes it difficult for a control processor to select the delay input values Delay1 and Delay2 and to choose when to switch the multiplexer to maintain a smooth and continuous pulse adjustment performance characteristic. This uncertainty in circuit operating characteristics detracts from The system level functional precision of an ATE system incorporating this type of circuit.

Therefore, there is a need for a circuit that more precisely adjusts the width of an input timing pulse. It is an object of the present invention to obviate or mitigate at least some of the above mentioned disadvantages.

SUMMARY OF THE INVENTION

In accordance with an aspect of the present invention, there is provided a method and a circuit for selectively adjusting the width of an input pulse. The circuit comprises two stages. The first stage delays a leading edge of the input pulse with respect to a trailing edge of the input pulse in accordance with a first control input. The second stage delays the trailing edge of the input pulse with respect to the leading edge of The input pulse in accordance with a second control input.

BRIEF DESCRIPTION OF THE DRAWINGS

Embodiments of the invention will now be described by way of example only, with reference to the following drawings in which.

DETAILED DESCRIPTION OF THE PREFERRED EMBODIMENTS

Figure 1:
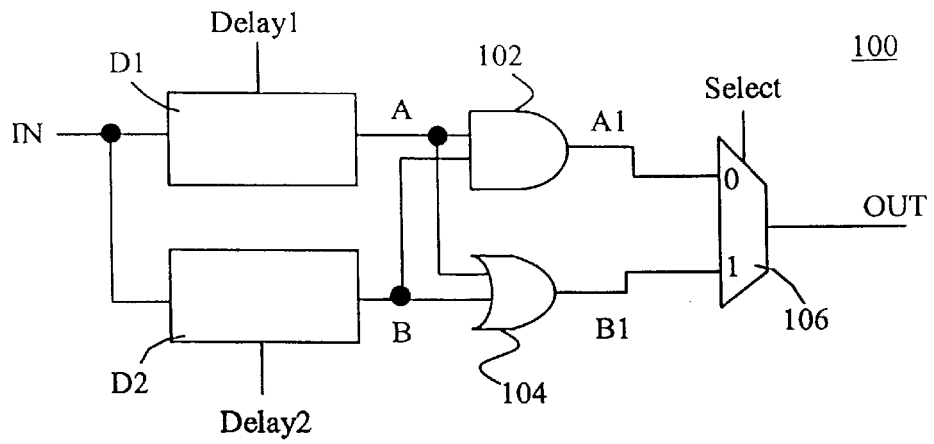
FIG. 1 is a schematic diagram of a pulse width adjusting circuit (prior art)
Figure 2:
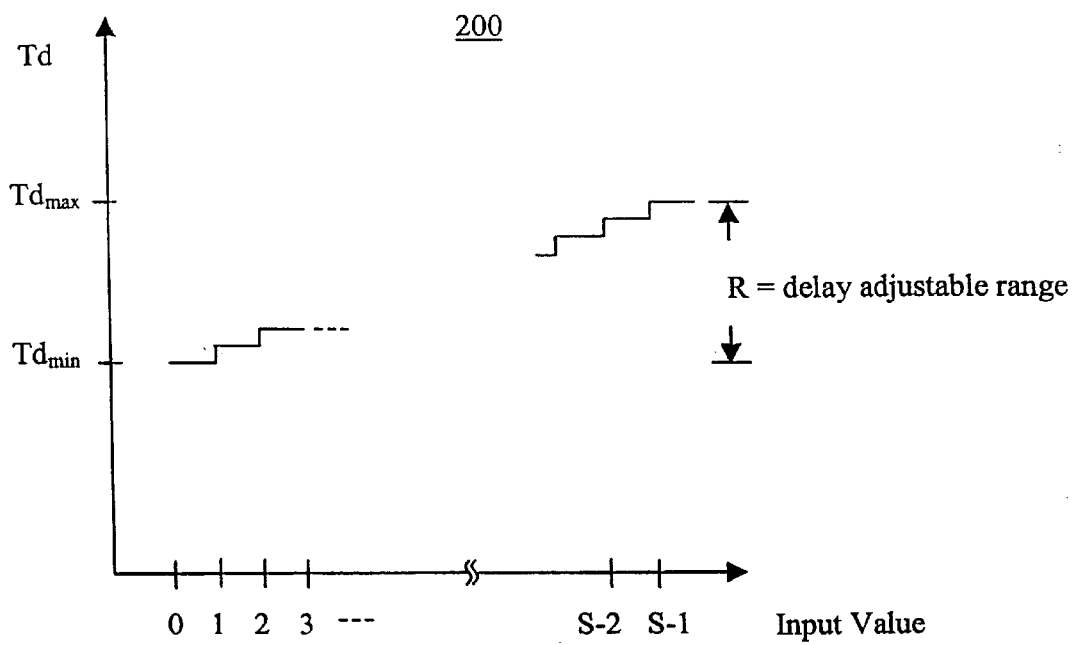
FIG. 2 is a graph illustrating the time delay of the delay elements illustrated in FIG. 1 (prior art)
Figure 3A:
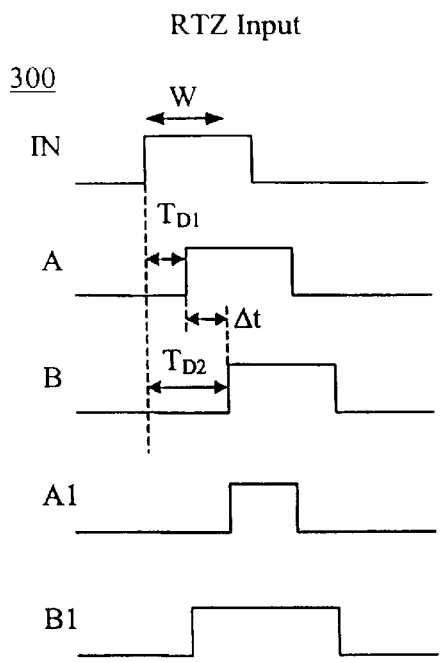
FIG. 3a and 3b are timing diagrams for the operation of the circuit illustrated in FIG. 1 (prior art)
Figure 3B:
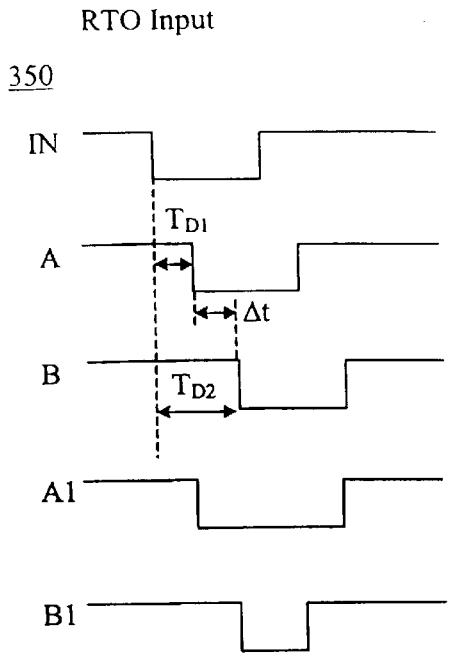
Figure 4:
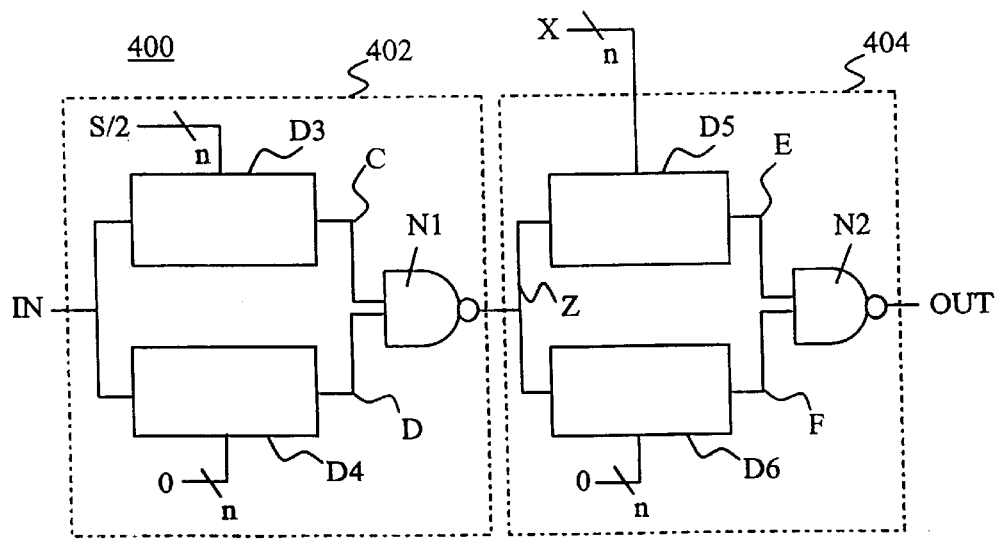
FIG. 4 is a schematic diagram of a pulse width adjusting circuit according to an embodiment of the present invention.

For convenience, like numerals in the description refer to like structures in the drawings. Referring to FIG. 4, a pulse width adjusting circuit in accordance with a first embodiment of the invention is illustrated generally by numeral 400. The circuit 400 comprises four identical digitally programmable delay elements D3, D4, D5, and D6 and a paw of NAND-gates N1 and N2. The circuit 400 is arranged in two stages 402 and 404.

A first stage 402 comprises two delay elements D3 and D4 and a NAND-gate N1. An input signal IN is coupled with inputs of the delay elements D3 and D4. An output C of the delay element D3 is coupled to a first input of the NAND-gate N1. An output D of the delay element D4 is coupled to a second input of the NAND-gate N1. A second stage 404 is similar in configuration to the first stage 402. A delay control input to delay element D3 is fixed at a mid-range (approximately S/2) while a delay control input to delay element D4 is fixed at the lowest setting (0).

The second stage 404 comprises two delay elements D5 and D6 and a NAND-gate N2. An output signal Z from NAND-gate N1 is coupled with inputs of the delay elements DS and D6. An output E of the delay element D5 is coupled to a first input of the NAND-gate N2. An output F of the delay element D6 is coupled to a second input of the NAND-gate N2. An output signal OUT from the NAND-gate N2 is the circuit's output. A delay control input to delay element D6 is fixed at the lowest setting (0) while a delay control input X to delay element D5 is received from an external source (not shown) and represents a variable delay control input to the circuit.

It is preferable that the four delay elements D3, D4, DS, and D6 have nearly identical timing characteristics. For example, in the present embodiment a preferable maximum tolerance between delay elements is approximately a quarter of the step delay size, or R/4(S−1). A person skilled in the art will appreciate that this tolerance may vary depending on the application. Furthermore, although it is possible that the delay elements vary within the tolerance, it is preferable to have as little variation as possible. This can be accomplished by fabrication of the four delay elements on a common integrated circuit. Alternately, this requirement can be achieved in a discrete implementation though selection of delay elements with similar operating characteristics. Alternately yet, four delay elements could be trimmed to closely match each other. Other methods for achieving these characteristics will be apparent to a person skilled in the art.

For the purpose of describing the operation of the circuit 400, the difference in timing characteristics for the four delay elements D3, D4, D5, and D6 are assumed to be negligible. Each of the delay elements D3, D4, D5, and D6 receives an n-bit binary delay control word input that selects one of S settings raging from 0 to S−1, where n≧log$_2$S. An input to output propagation delay Td for each delay element has a minimum value $Td_{min}$ for a control word input value of 0 to a maximum value $Td_{max}$ for a control word input value of S−1. An adjustable range R for each delay element is defined as R=$Td_{max}$−$Td_{min}$. It is assumed that the delay elements operate linearly between the minimum and maximum settings, with the delay per step being approximately R/(S−1).

Figure 5:
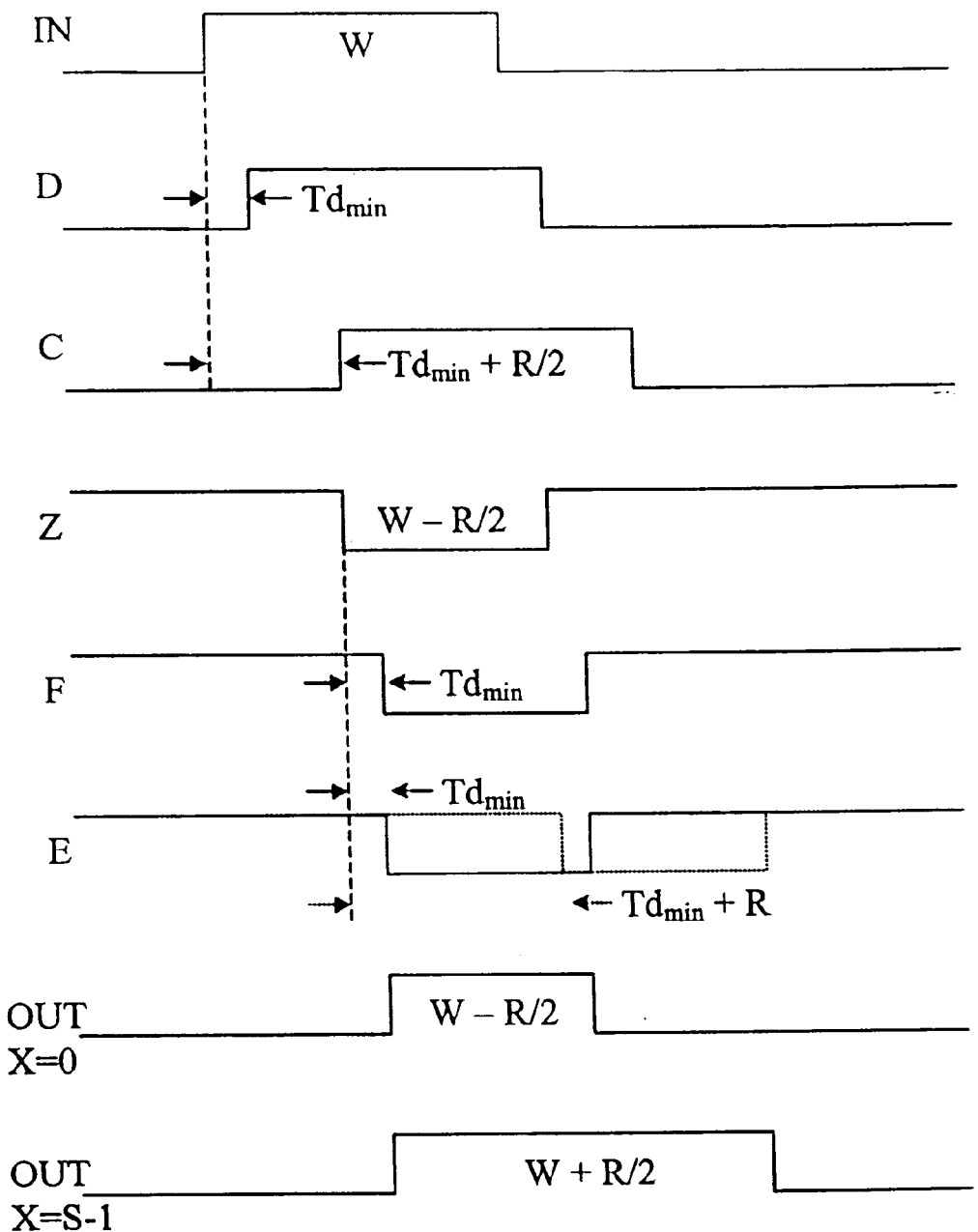
FIG. 5 is a timing diagram for the operation of the circuit illustrated in FIG. 4.
Figure 6:
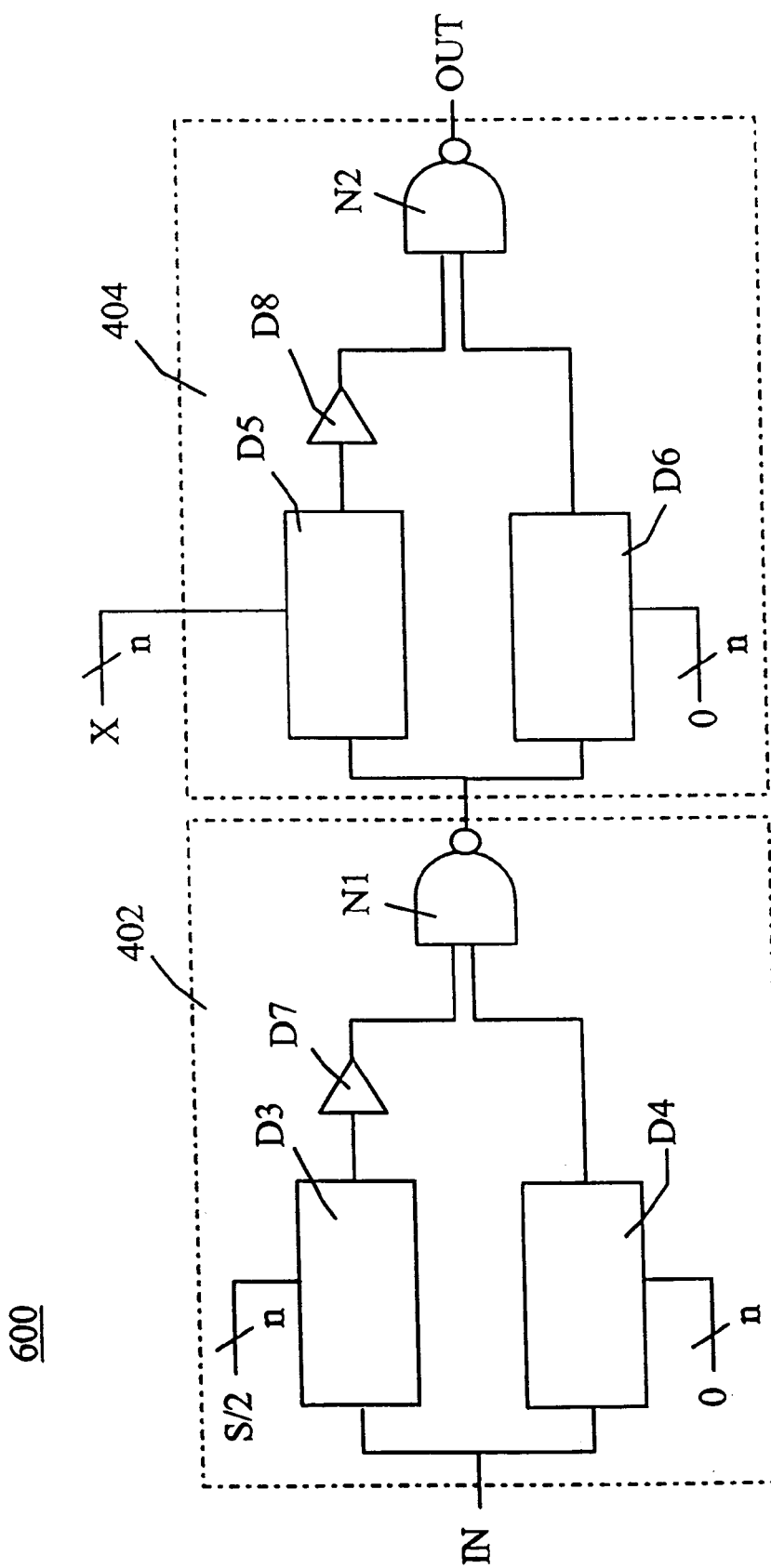
FIG. 6 is a schematic diagram of a pulse width adjusting circuit according to a further embodiment of the present invention.

The first stage 402 delays the rising edge of a propagated RTZ pulse by half the delay element adjustable range R/2, with respect to the falling edge of the propagated pulse. This is achieved by fixing the delay control inputs for D3 and D4 to S/2 and 0 respectively. Thus, an input pulse having a width W is delayed for a time of $Td_{min}$ by D4 and delayed by a time of $Td_{min}$+R2 by D3, resulting in a RTO pulse having a width W−R/2. Referring to FIG. 5, a timing diagram for the circuit shown in FIG. 4 is illustrated generally by numeral 500. As illustrated, a timing pulse having a width W is present at the input IN. At the output D of delay element D4, the timing pulse is delayed by $Td_{min}$ since the delay control input value to D4 is 0. At the output C of delay element D3, the timing pulse is delayed by $Td_{min}$+R/2 since the delay control input value to D3 is S/2. The NAND-gate N1 combines the delay element outputs D and C such that its output Z is high unless both delay element outputs D and C are high. This results in the RTO timing pulse illustrated. Furthermore, since the timing difference Δt between the delay element outputs D and C is R/2, the width of the NAND-gate output Z is W−R/2.

Conversely, the second stage 404 selectively delays falling edges in a propagated pulse with respect to rising edges in the propagated pulse. The second stage 404 functions in a similar manner to the first stage 402 but instead of having a fixed control input, the control input to D5 can vary from 0 to S−1. As described with reference to the first stage 402, the NAND-gate N1 inverts the input signal. Similarly, the NAND-gate N2 inverts the output of the second stage, thus reverting the back to a RTZ pulse having a width depending on the control input to D5. Referring once again to FIG. 5, at the output F of delay element D6 the output Z of NAND-gate N1 is delayed by $Td_{min}$. At the output E of delay element D5, the output Z of NAND-gate N1 is delayed according to the value of the variable delay control input X. Thus, the delay at the output E of the delay element D5 can provide a time delay that ranges fom $Td_{min}$ to $Td_{max}$. The output OUT of the NAND-gate N2 is logic low unless either of the delay element outputs E and F are logic low. If the variable delay control input X is set to 0, the delay at the output E of the delay element D5 is $Td_{min}$. Since the timing difference Δt between the delay element outputs E and F is 0, the width of the NAND-gate output OUT is W−R/2. If the variable delay control input X is set to S−1, the delay at the output E of the delay element D5 is $Td_{max}$. Since the timing difference Δt between the delay element outputs E and F is R, the width of the NAND-gate output OUT is W+R/2.

Although the embodiment described above illustrates the functionality of the circuit having an RTZ pulse as its input, a person skilled in the an will appreciate that the input pulse may also be an RTO pulse. Thus, for generality the rising edge of an RTZ pulse, which corresponds to a falling edge of an RTO pulse, will also be referred to as a leading edge. Similarly, the falling edge of an RTZ pulse, which corresponds to a rising edge of an RTO pulse, will also be referred to as a trailing edge.

The effective overall operation of the circuit 400 can be described as follows. The first stage 402 of the circuit 400 delays the leading edge of an incoming pulse IN with respect to its trailing edge by R/2. The second stage 404 of the circuit 400 delays the trailing edge of its incoming pulse Z with respect to its leading edge by a variable time delay amount defined by the variable delay control input X. If the variable delay control input X is 0, the leading edge is delayed by R/2 and the trailing edge is not delayed at all. Thus, the width of the output pulse OUT is W−R/2. If the variable delay control input X provides an R/2 delay amount in delay element D5, both the leading edge and trailing edges are delayed by the same amount and the output pulse width is W. Thus, the pulse delivered through output OUT has the same width as the pulse provided through input IN. If the variable delay control input X provides an R delay in delay element D5, the leading edge is delayed by R/2 and the trailing edge is delay by R. Thus, The width of output pulse OUT is W+R/2. Furthermore, a person skilled in the art will appreciate that different values for the variable delay amount will result in different pulse widths. Therefore, it can be seen that the circuit described with reference to figure 400 precisely adjusts the width of an input timing pulse.

The embodiment described with reference to FIG. 4 may in some instances suffer in its operating characteristics from an increase in propagation delay caused by NAND-gate N2. Specifically, the operating characteristics may suffer when both inputs to the NAND-gate N2 fall within a time interval of a similar order to the switching time of the NAND-gate N2 inputs and outputs. This can occur, for example, if the input control to delay element D5 is close to zero and the resolution R/(S-1) of the delay elements is smaller than the rise and fill time of the inputs and output of the NAND-gate N2.

In an alternate embodiment of the invention, an alterate implementation of the pulse width adjusting circuit that avoids this problem is provided. Referring to FIG. 5, a preferred pulse width adjusting circuit is illustrated generally by numeral 500. The improved circuit is similar to the circuit illustrated in figure 400, except that it further includes fixed delay elements D7 and D8. Fixed delay element D7 is coupled between the output C of delay element D3 and the input of NAND-gate N1. Fixed delay element D8 is coupled between the output E of delay element D5 and the input of NAND-gate N2. The delay of fixed delay elements D7 and D8 is of the order of the maximum of the rise and fall time of the inputs and output of NAND-gate N2. Fixed delay element D8 provides a minimum separation between the arrival of the falling edge inputs to N2. The separation avoids undesired modulation of the propagation delay of NAND-gate N2. Fixed delay element D7 cancels out the timing offset introduced to the second stage by D8, and retains the ability to shrink or grow pulse widths by an equal amount.

The pulse width adjusting circuits described in the different embodiments of the invention may be used to precisely manipulate or trim the pulse width of periodic signals for purposes other than stimulus waveform shaping in automated test equipment. Other applications include pre-signal and post-signal compensation for communications across transmission channels susceptible to bandwidth limitation, intersymbol interference and other distortions. Another potential application is in clock generation and distribution in large, high performance integrated circuits. The adjustable waveform provided by the pulse-shaping circuit would be useful for compensating for non-uniformities in the clock distribution interconnect. Yet another use for the pulse-shaping circuit is to selectively change a clock waveform locally or globally for the assisting in design verification, engineering characterization, and timing margin assessment and guard banding during manufacturing related testing.

Although the invention has been described with reference to certain specific embodiments, various modifications thereof will be apparent to those skilled in the art without departing from the spirit and scope of the invention as outlined in the claims appended hereto.

The Embodiments of the invention in which an exclusive property or privilege is claimed are defined as follows:

1. A digitally controlled circuit for selectively adjusting an input pulse width, said circuit comprising:

(a) a first stage for delaying a leading edge of said input pulse with respect to a trailing edge of said input pulse in accordance with a first control input; and (b) a second stage for delaying said trailing edge of said input pulse with respect to said leading edge of said input pulse in accordance with a second control input;

wherein said input pulse width is adjusted in accordance with a difference between said delay of said leading edge and said delay of said trailing edge.

2. A circuit as defined in claim 1, wherein said first control input is fixed and said second control input is variable such that said width of said input pulse is altered by an amount determined by said second control input.

3. A circuit as defined in claim 1, wherein said first stage comprises a first and a second digital delay element for delaying said input pulse in parallel, and a first logic gate for combining outputs of said first and second delay elements for providing said delayed leading edge of said input pulse, said first and second digital delay elements having a predefined delay range.

4. A circuit as defined in claim 2, wherein said second stage comprises a third and a fourth digital delay element for delaying said input pulse in parallel, and a second logic gate for combining outputs of said third and fourth delay elements for providing said delayed trailing edge of said input pulse, said third and fourth digital delay elements having a predefined delay range.

5. A circuit as defined in claim 3, wherein said first digital delay element is delayed by half of said predefined delay range, said second and third digital delay elements are delayed by a minimum value of said predefined delay range, and said fourth delay element is delayed by a variable value in said delay range.

6. A circuit as defined in claim 3 further comprising a fixed delay element for delaying said output of said first digital delay element before it is input to said first logic gate.

7. A circuit as defined in claim 4 further comprising a fixed delay element for delaying said output of said third digital delay element before it is input to said second logic gate.

8. A circuit as defined in claim 1, wherein said first and said second stages have substantially equivalent timing.

9. A method for selectively adjusting an input pulse width using a digitally controlled circuit, said method comprising the steps of:

a) delaying a leading edge of said input pulse by a first predefined amount using a first stage of said circuit; and b) delaying a trailing edge of said input pulse by a second predefined amount using a second stage of said circuit;

wherein said input pulse width is adjusted in accordance with a difference between said first and second predefined amounts.

10. A method as defined in claim 9, wherein said first predetermined amount is fixed and said second predetermined amount is variable.

11. A method as defined in claim 9, where said steps of delaying said leading edge and delaying said wailing edge have substantially equivalent timing.

* * * * *